US010013086B2

(12) United States Patent
Yang et al.

(10) Patent No.: US 10,013,086 B2
(45) Date of Patent: Jul. 3, 2018

(54) IN CELL TOUCH PANEL AND METHOD FOR DRIVING THE SAME, AND DISPLAY DEVICE (71) Applicants: BOE Technology Group Co., Ltd., Beijing (CN); Beijing BOE Optoelectronics Technology Co., Ltd., Beijing (CN)

(72) Inventors: Shengji Yang, Beijing (CN); Xue Dong, Beijing (CN); Haisheng Wang, Beijing (CN); Xiaoliang Ding, Beijing (CN); Yingming Liu, Beijing (CN); Weijie Zhao, Beijing (CN); Changfeng Li, Beijing (CN); Wei Liu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 120 days.

(21) Appl. No.: 14/912,993

(22) PCT Filed: May 12, 2015

(86) PCT No.: PCT/CN2015/078793
§ 371 (c)(1),
(2) Date: Feb. 19, 2016

(87) PCT Pub. No.: WO2016/119333
PCT Pub. Date: Aug. 4, 2016

(65) Prior Publication Data
US 2016/0349889 A1 Dec. 1, 2016

(30) Foreign Application Priority Data
Jan. 26, 2015 (CN) .......................... 2015 1 0038902

(51) Int. Cl.
G06F 3/041 (2006.01)
G02F 1/1333 (2006.01)
(Continued)

(52) U.S. Cl.
CPC ........ *G06F 3/0412* (2013.01); *G02F 1/13338* (2013.01); *G02F 1/13439* (2013.01);
(Continued)

(58) Field of Classification Search
CPC ...... G06F 3/0412; G06F 3/044; G06F 3/0416; G06F 3/041; G06F 2203/04103;
(Continued)

(56) References Cited

U.S. PATENT DOCUMENTS 9,152,283 B2 * 10/2015 Shepelev ................ G06F 3/044
9,372,564 B2 * 6/2016 Wang ...................... G06F 3/041
(Continued)

FOREIGN PATENT DOCUMENTS

| CN | 103150070 A | 6/2013 |
| CN | 103838431 A | 6/2014 |

(Continued)

OTHER PUBLICATIONS

International Search Report and Written Opinion for International Patent Application No. PCT/CN2015/078793, dated Oct. 27, 2015, 8 pages.
(Continued)

*Primary Examiner* — Dismery Mercedes
(74) *Attorney, Agent, or Firm* — Westman, Champlin & Koehler, P.A.

(57) ABSTRACT

An in cell touch panel and a method for driving the same, and a display device are provided. A transparent conductive layer is divided into second touch electrodes and common electrodes, that is, a conventional entire common electrode layer is divided into second touch electrodes and common (Continued)

electrodes insulated from each other; accordingly, during a display operation, both the second touch electrodes and the common electrodes are applied with common electrode signals; and, during an touch operation, ones of the first touch electrodes and the second touch electrodes are applied with touch scanning signals while the other ones of the first touch electrodes and the second touch electrodes are coupled to the touch scanning signals and perform outputting, so that a touch function and a display function are achieved by asynchronous drivings. The second touch electrodes are manufactured such that no additional steps should be included for sole manufacture of the second touch electrode.

19 Claims, 8 Drawing Sheets

(51) Int. Cl.
*G09G 3/36* (2006.01)
*G06F 3/044* (2006.01)
*G02F 1/1335* (2006.01)
*G02F 1/1343* (2006.01)
*G02F 1/1362* (2006.01)
*H01L 27/12* (2006.01)

(52) U.S. Cl.
CPC .. *G02F 1/133512* (2013.01); *G02F 1/134336* (2013.01); *G02F 1/136286* (2013.01); *G06F 3/041* (2013.01); *G06F 3/044* (2013.01); *G06F 3/0416* (2013.01); *G09G 3/36* (2013.01); *G09G 3/3648* (2013.01); *H01L 27/124* (2013.01); *G02F 2001/134345* (2013.01); *G02F 2201/121* (2013.01); *G02F 2201/123* (2013.01); *G06F 2203/04103* (2013.01)

(58) Field of Classification Search
CPC .. G06F 2203/04111; G09G 2300/0426; G09G 3/3648; G09G 3/3655; G02F 1/13338; G02F 1/1333
See application file for complete search history.

(56) References Cited

U.S. PATENT DOCUMENTS

| | | | |
|---|---|---|---|
| 9,495,935 B2 | 11/2016 | Xu et al. | |
| 9,529,469 B2 * | 12/2016 | Liu | G06F 3/0412 |
| 9,612,678 B2 * | 4/2017 | Chen | G02F 1/13338 |
| 9,645,686 B2 * | 5/2017 | Liu | G06F 3/0412 |
| 9,886,123 B2 * | 2/2018 | Xu | G06F 3/0416 |
| 9,927,919 B2 * | 3/2018 | Qian | G06F 3/0418 |
| 2012/0218482 A1 * | 8/2012 | Hwang | G06F 3/044 349/12 |
| 2012/0274603 A1 * | 11/2012 | Kim | G06F 3/0412 345/174 |
| 2014/0247242 A1 | 9/2014 | Lee et al. | |
| 2014/0247402 A1 * | 9/2014 | Chou | G02F 1/13338 349/12 |
| 2014/0375534 A1 * | 12/2014 | Lee | G09G 3/3648 345/87 |
| 2015/0035791 A1 * | 2/2015 | Mo | G09G 3/3648 345/174 |
| 2015/0277655 A1 * | 10/2015 | Kim | G06F 3/0412 345/174 |
| 2016/0170538 A1 * | 6/2016 | Wang | G06F 3/0412 345/173 |
| 2016/0188097 A1 * | 6/2016 | Shin | G06F 3/0416 345/173 |

FOREIGN PATENT DOCUMENTS

| | | |
|---|---|---|
| CN | 103995616 A | 8/2014 |
| CN | 104035624 A | 9/2014 |
| CN | 104205025 A | 12/2014 |
| CN | 104503633 A | 4/2015 |
| JP | 2014-102699 A | 6/2014 |

OTHER PUBLICATIONS

English translation of Box No. V from the Written Opinion of the International Search Report for International Patent Application No. PCT/CN2015/078793, 2 pages.
First Office Action, including Search Report, for Chinese Patent Application No. 201510038902.9, dated Jan. 18, 2017, 14 pages.
Second Office Action from Chinese Patent Application No. 201510038902.9, dated Jun. 30, 2017, 12 pages.

\* cited by examiner

IN CELL TOUCH PANEL AND METHOD FOR DRIVING THE SAME, AND DISPLAY DEVICE

CROSS-REFERENCE TO RELATED APPLICATION

This application is a Section 371 National Stage Application of International Application No. PCT/CN2015/078793, filed on May 12, 2015, entitled "In Cell Touch Panel And Method For Driving The Same, And Display Device", which has not yet published, which claims priority to Chinese Application No. 201510038902.9, filed on Jan. 26, 2015, incorporated herein by reference in their entirety.

BACKGROUND

Technical Field

Embodiments of the present invention relate to the field of touching technologies, and particularly, to an in cell touch panel and a method for driving the same, and a display device.

Description of the Related Art

With the rapid development of the display technology, touch panel has been gradually spread throughout the life of people. Nowadays, according to structure and component, the touch panels are categorized into: Add on Mode Touch Panel, On Cell Touch Panel, and In Cell Touch Panel. As to the Add on Mode Touch Panel, the touch screen and the liquid crystal display (LCD) are manufactured separately, and then they are assembled together to form a liquid crystal display having a touch function. The Add on Mode Touch Panel has disadvantages of relatively higher manufacture cost, relatively lower light transmittance and relatively greater thickness of the module. However, as to the In Cell Touch Panel, touch electrodes of the touch panel are embedded inside the liquid crystal screen, which decreases thickness of the module, as well as greatly reduces manufacture cost of the touch panel, so it is favored by the major panel manufacturers.

At present, conventional in cell touch panel mainly achieves detection of positions of finger's touch operations by means of utilizing principle of mutual capacitance. In a specific implementation, it is obtained by direct additions of the touch scanning lines and the touch sensing lines on conventional thin film transistor (TFT) array substrate; that is, on a surface of the TFT array substrate, two layers of transparent conductive electrodes (generally, strip-shaped indium tin oxides (ITO) electrodes), which are intersected with each other, are formed and they are used as the touch driving lines and the touch sensing lines of the touch panel, and a sensing capacitor is formed at a place where the two layers of ITO electrodes are intersected with each other. It has the following working process. When touch driving signal is applied on the ITO electrodes serving as touch driving lines, voltage signal coupled to the touch sensing lines through the sensing capacitor is detected. During this process, when a human body gets into contact with the touch panel, an electrical field from the human body will act on the sensing capacitor and make value of capacitance of the sensing capacitor change, so as to vary the voltage signal coupled to the touch sensing lines. As a result, position of the touch point will be determined in accordance with variation of the voltage signal.

In a structural design of the abovementioned conventional in cell touch panel, new layers are required to be added onto traditional TFT array substrate, which results in addition of additional process in the manufacturing of the TFT array substrate, as a result, the manufacture cost is increased, and it is not advantageous to improvement of the manufacture efficiency.

SUMMARY

Accordingly, according to one aspect, embodiments of the present invention provide an in cell touch panel, comprising a first substrate and a second substrate which are opposite to each other, a transparent conductive layer provided to a side of the first substrate facing the second substrate, and a plurality of first touch electrodes insulated from the transparent conductive layer and provided in different layers with the transparent conductive layer; wherein, the transparent conductive layer is divided into a plurality of sub-electrodes being independent from each other and arranged in a matrix; wherein, the sub-electrodes which are in odd-numbered rows are second touch sub-electrodes, the sub-electrodes which are in even-numbered rows are common electrodes, and the second touch sub-electrodes in one column constitute one second touch electrode; or ones of the sub-electrodes which are in even-numbered rows and the sub-electrodes which are in even-numbered rows are second touch sub-electrodes, the other ones of the sub-electrodes which are in odd-numbered rows and the sub-electrodes which are in odd-numbered rows are common electrodes, and the second touch sub-electrodes in one column or in one row constitute one second touch electrode;

an extension direction of the first touch electrodes is perpendicular to an extension direction of the second touch electrodes, and, the first touch electrodes are provided to be respectively opposite to, rows or columns of the common electrodes which are perpendicular to the second touch electrodes; and ones of the first touch electrodes and the second touch electrodes are touch driving electrodes, and the other ones of the first touch electrodes and the second touch electrodes are touch sensing electrodes.

Correspondingly, according to another aspect, embodiments of the present invention also provide a method for driving the abovementioned in cell touch panel, and, the method comprises: performing a display scanning and a touch scanning asynchronously, within a frame of time; wherein, in a display scanning time slice, common electrode signals are applied onto all the sub-electrodes of the transparent conductive layer; and in a touch scanning time slice, a touch scanning signal is applied onto the touch driving electrode, and the touch sensing electrode is coupled to the touch scanning signal and performs outputting.

Correspondingly, according to still another aspect, embodiments of the present invention also provide a display device comprising an in cell touch panel according to any of the abovementioned embodiments of the present invention.

DETAILED DESCRIPTION OF THE EMBODIMENTS

Specific embodiments of the present invention will be described hereinafter in detail, and examples of these specific embodiments will be shown in the attached drawings, wherein the like reference numerals always refer to the like elements. The following description of the specific embodiments of the present invention with reference to the attached drawings is exemplary and is intended to explain the present invention and should not be construed as limiting the present invention.

A detailed description of these particular examples of an in cell touch panel and a method for driving the same and a display device according to embodiments of the present invention will be provided in conjunction with these attached drawings.

Thicknesses and shapes of these layers shown in the attached FIGS. do not reflect their actual scale, but only aim to illustrate and explain the technical contents of the present invention.

Figure 1:
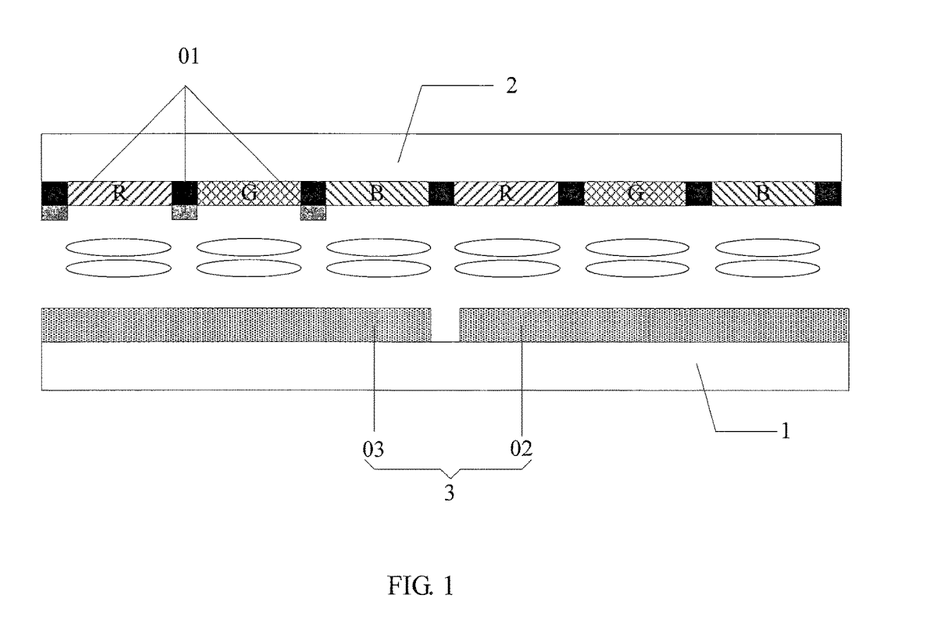
FIG. 1 is a schematic sectional view of an in cell touch panel according to an embodiment of the present invention.

Embodiments of the present invention provide an in cell touch panel. Referring to FIG. 1, the in cell touch panel comprises a first substrate 1 and a second substrate 2 which are opposite to each other, a transparent conductive layer 3 provided to a side of the first substrate 1 facing the second substrate 2, and a plurality of first touch electrodes 01 insulated from the transparent conductive layer 3 and provided in different layers with the transparent conductive layer.

Figure 2A:
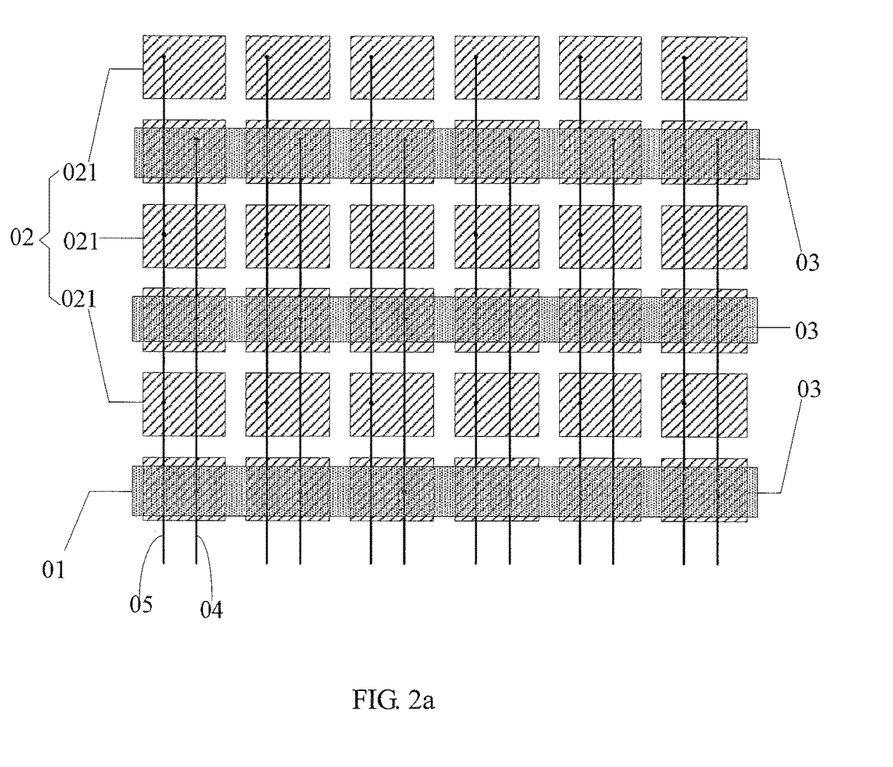
FIG. 2*a* is a first schematic top view of an in cell touch panel according to an embodiment of the present invention.
Figure 2B:
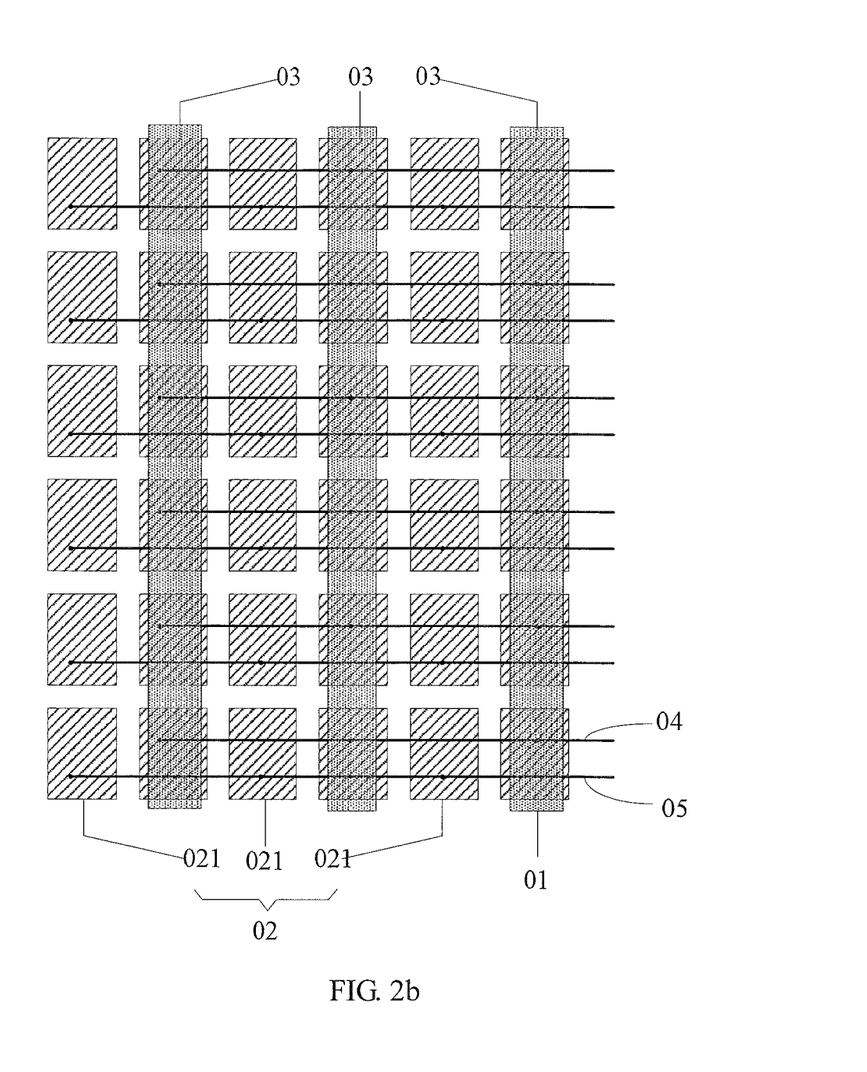
FIG. 2*b* is a second schematic top view of an in cell touch panel according to an embodiment of the present invention.

Referring to FIG. 2a and FIG. 2b, the transparent conductive layer 3 is divided into a plurality of sub-electrodes being independent from each other and arranged in a matrix.

As shown in FIG. 2a, the sub-electrodes which are in odd-numbered rows are second touch sub-electrodes 021, the sub-electrodes which are in even-numbered rows are common electrodes 03, and the second touch sub-electrodes 021 in one column constitute one second touch electrode 02. Or, as shown in FIG. 2b, the sub-electrodes which are in odd-numbered columns are second touch sub-electrodes 021, the sub-electrodes which are in even-numbered columns are common electrodes 03, and the second touch sub-electrodes 021 in one row constitute one second touch electrode 02. Or, in an embodiment that is not shown, the sub-electrodes which are in even-numbered rows are second touch sub-electrodes 021, the sub-electrodes which are in odd-numbered rows are common electrodes 03, and the second touch sub-electrodes 021 in one column constitute one second touch electrode 02. Or, in another embodiment that is not shown, the sub-electrodes which are in even-numbered columns are second touch sub-electrodes 021, the sub-electrodes which are in odd-numbered columns are common electrodes 03, and the second touch sub-electrodes 021 in one row constitute one second touch electrode 02.

That is to say, according to the embodiments of the present invention, in the transparent conductive layer 3, the second touch sub-electrodes 021 and the common electrodes 03 are arranged alternately in rows, while the second touch sub-electrodes 021 in the same column constitute one second touch electrode 02; or, the second touch sub-electrodes 021 and the common electrodes 03 are arranged alternately in columns, while the second touch sub-electrodes 021 in the same row constitute one second touch electrode 02.

An extension direction of the first touch electrodes 01 is perpendicular to an extension direction of the second touch electrodes 02, and, the first touch electrodes 01 are provided to be respectively opposite to, rows or columns of the common electrodes 03 which are perpendicular to the second touch electrodes 02.

The first touch electrodes 01 are touch driving electrodes and the second touch electrodes 02 are touch sensing electrodes; or, the first touch electrodes 01 are touch sensing electrodes and the second touch electrodes 02 are touch driving electrodes.

In the above-mentioned in cell touch panel provided according to embodiments of the present invention, a transparent conductive layer is divided into second touch electrodes and common electrodes, that is, a conventional entire common electrode layer is divided into second touch electrodes and common electrodes insulated from each other; accordingly, during a display operation, both the second touch electrodes and the common electrodes are applied with common electrode signals; and, during an touch operation, the first touch electrodes (or the second touch electrodes) are applied with touch scanning signals while the second touch electrodes (or the first touch electrodes) are coupled to the touch scanning signals and perform outputting, so that a touch function and a display function are achieved by asynchronous drivings. In the in cell touch panel provided according to embodiments of the present invention, the second touch electrodes are manufactured by performing some changes on conventional structure of the common electrode layer, accordingly, on the basis of the conventional manufacture steps, no additional steps should be included for sole manufacture of the second touch electrode, which reduces the production cost while improving the production efficiency.

Also, in the above-mentioned in cell touch panel, the transparent conductive layer is divided into a plurality of sub-electrodes being independent from each other and arranged in a matrix, which not only ensures uniform distribution of the sub-electrodes of the entire touch panel, but also ensures match of loads of the common electrodes with that of the second touch sub-electrodes since the sub-electrodes of which the common electrode is made up has the same structure as the sub-electrodes of which the second touch electrode is made up. In addition, the first touch electrodes are provided to be in positions opposite to the common electrodes, so that no overlapped regions are formed between the first touch electrodes and the second touch electrodes, so as to reduce coupling capacitance between the first touch electrode and the second touch electrode, to the utmost extent.

In a specific implementation, in the above-mentioned in cell touch panel provided according to embodiments of the present invention, in order not to adversely affect normal display function, dividing lines generally are within regions of a pattern of the black matrix layer but are kept away from these opened regions for displaying, in division of the transparent conductive layer. That is, orthographic projections of the gaps, among these sub-electrodes, on the first substrate or the second substrate are generally at gaps among these sub-pixels.

Specifically, in a specific implementation, in the above-mentioned in cell touch panel provided according to embodiments of the present invention, the first substrate may be an array substrate and the second substrate is an opposite substrate; of course, the first substrate may be an opposite substrate and the second substrate is an array substrate. There is no limitation on this.

Furthermore, in a specific implementation, in the above-mentioned in cell touch panel provided according to embodiments of the present invention, the first touch electrodes and the second touch electrodes may be both provided on the same substrate, or may be provided on different substrates, respectively. There is no limitation on this. Preferably, in the above-mentioned in cell touch panel provided according to the embodiment of the present invention, as shown in FIG. 1, these first touch electrodes 01 are provided to a side of the second substrate 2 facing the first substrate 1.

The above-mentioned in cell touch panel provided according to embodiments of the present invention, not only is suitable for Twisted Nematic (TN) type liquid crystal display screen, but also is suitable for Advanced Dimension Switch (ADS) type liquid crystal display screen, High-Advanced Dimension Switch (HADS) type liquid crystal display screen and In-Plane Switch (IPS) type liquid crystal display screen.

Moreover, when the above-mentioned in cell touch panel provided according to embodiments of the present invention is applied to an ADS type liquid crystal display screen, a common electrode layer having a plate-like structure is provided below a slit-like pixel electrode, that is, the common electrodes are provided between the lower substrate and the pixel electrodes, and an insulation layer is also provided between the common electrodes and the pixel electrodes. When the in cell touch panel is applied to an HADS type liquid crystal display screen, slit-like common electrodes are provided above a pixel electrode having a plate-like structure, that is, the pixel electrode is provided between the lower substrate and the common electrodes, and an insulation layer is also provided between the common electrodes and the pixel electrode.

In a specific implementation, the above-mentioned in cell touch panel provided according to embodiments of the present invention is more suitable for ADS type or HADS type liquid crystal display screen. As a result, the above common electrodes and second touch electrodes are formed by separating a common electrode layer on an array substrate in prior art.

Furthermore, in the above-mentioned in cell touch panel provided according to embodiments of the present invention, material for the first touch electrode may be metal material, or, transparent conductive material. There is no limitation on this.

Figure 3A:
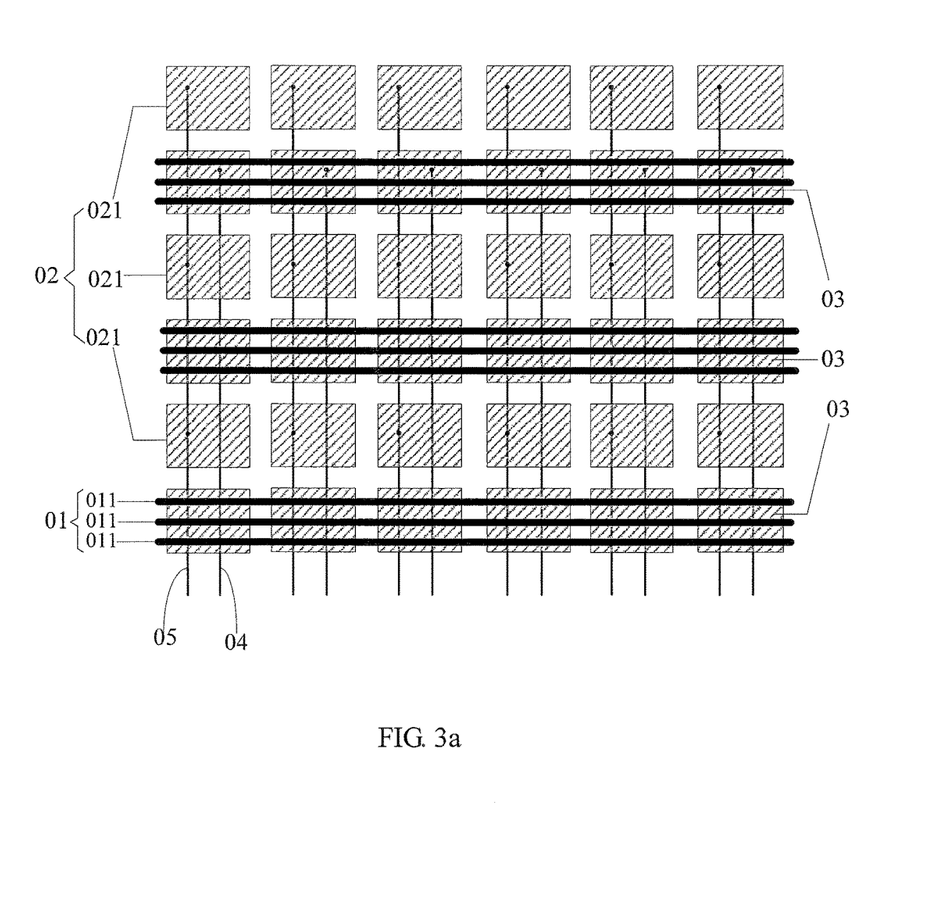
FIG. 3a is a third schematic top view of an in cell touch panel according to an embodiment of the present invention.
Figure 3B:
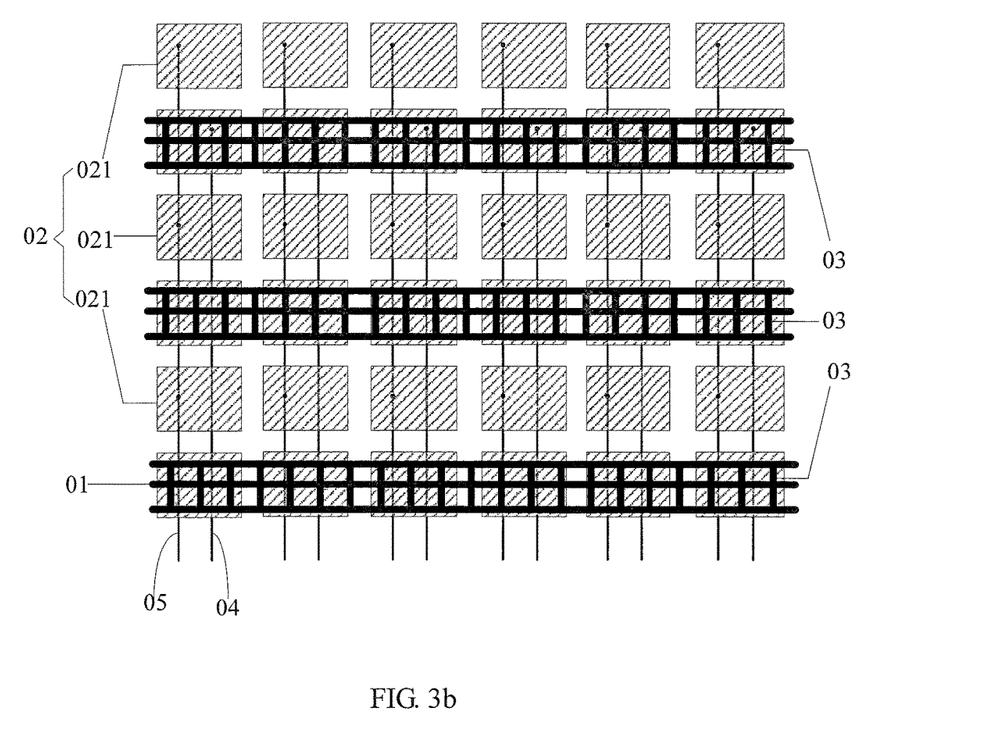
FIG. 3b is a fourth schematic top view of an in cell touch panel according to an embodiment of the present invention.

Furthermore, in a specific implementation, in the above-mentioned in cell touch panel provided according to embodiments of the present invention, if the material for the first touch electrode is transparent conductive material, since the aperture ratio is not necessary to be taken into consideration, the first touch electrode 01 may be provided as a surface electrode structure covering a row or a column of common electrodes 03, as shown in FIG. 2a and FIG. 2b. Of course, it also may be provided as a multiple strip-shaped structure as shown in FIG. 3a, or, a grid-shaped structure as shown in FIG. 3b. There is no limitation on this.

In a specific implementation, in the above-mentioned in cell touch panel provided according to embodiments of the present invention, if the material for the first touch electrode is metal material, the aperture ratio will be adversely affected since most of the metal materials are opaque, accordingly, area of projection of the first touch electrode should be reduced as far as possible. As a result, as shown in FIG. 3a, each first touch electrode 01 may be made up of a plurality of strip-shaped first touch sub-electrodes 011; or, as shown in FIG. 3b, each first touch electrode 01 may have a grid-shaped structure. Preferably, each first touch electrode 01 made up of a plurality of strip-shaped first touch sub-electrodes 011 will have a better touch effect.

Furthermore, if the material for the first touch electrode is metal material, in order to prevent the aperture ratio from being adversely affected by the first touch electrode, in the above-mentioned in cell touch panel provided according to embodiments of the present invention, the in cell touch panel further comprises a black matrix layer provided to the side of the first substrate facing the second substrate, or to the side of the second substrate facing the first substrate; orthographic projection of a pattern of each first touch electrode on the first substrate is within a region where a pattern of the black matrix layer is disposed.

Furthermore, in a specific implementation, when the above-mentioned in cell touch panel provided according to embodiments of the present invention is applied to ADS type or HADS type liquid crystal display screen, that is, when the first substrate is an array substrate and the second substrate is an opposite substrate, as shown in FIG. 2a and FIG. 2b, the in cell touch panel may further comprise:

common electrode wires 04 and conducting wires 05 provided to the side of the first substrate 1 facing the second substrate 2 and disposed in different layers with the transparent conductive layer 3; wherein, the common electrode 03 is electrically connected to the corresponding common electrode wire 04 through via-holes (e.g., see FIG. 4a and FIG. 4b), and, the second touch electrode 02 is electrically connected to the corresponding conducting wire 05 through via-holes.

Preferably, in order to reduce a contact resistance between the common electrode and the common electrode wire, the common electrode may be electrically connected to the common electrode wire through a plurality of via-holes. Similarly, the second touch electrode may also be electrically connected to the conducting wire through a plurality of via-holes. There is no limitation on this.

Preferably, in order to simplify manufacturing process and further reduce manufacturing cost, in the above-mentioned in cell touch panel provided according to embodiments of the present invention, the conducting wires and the common electrode wires are disposed in the same layer with each other, and extension directions of the conducting wires and the common electrode wires are the same as the extension direction of the second touch electrode. As a result, in manufacture, the conducting wires and the common electrode wires are disposed in the same layer, and are obtained by altering the pattern of the corresponding layer without addition of any new manufacturing process, so as to simplify the processing steps, save the manufacture cost and improve the production efficiency. Moreover, extension directions of the conducting wires and the common electrode wires are disposed to be the same as that of the second touch electrodes, which not only facilitates connections between the conducing wires and the second touch electrodes, but also ensures that there is no cross between the conducting wires and the common electrode wires, to avoid crosstalk among these electrodes.

Figure 4A:
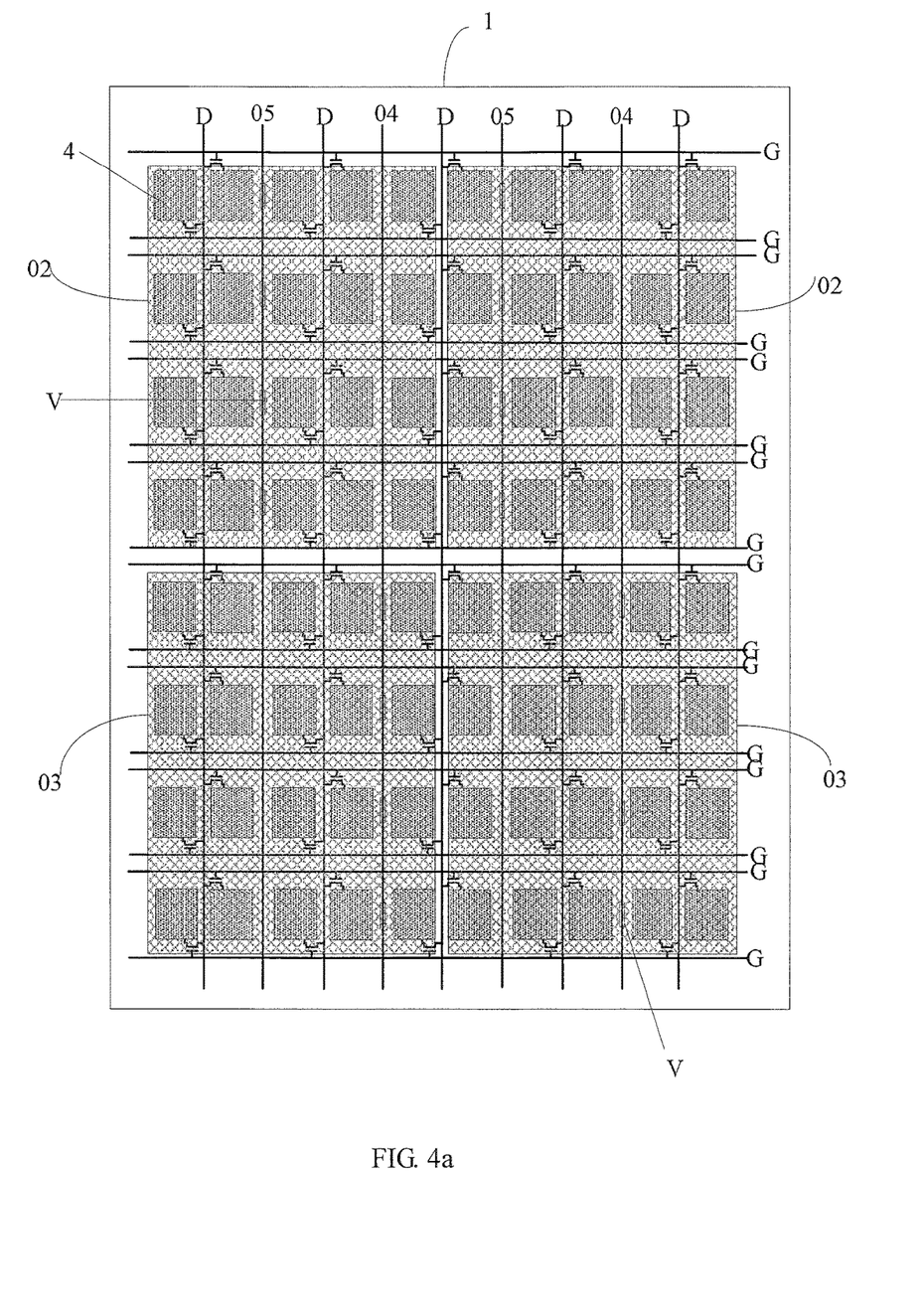
FIG. 4a is a fifth schematic top view of an in cell touch panel according to an embodiment of the present invention.
Figure 4B:
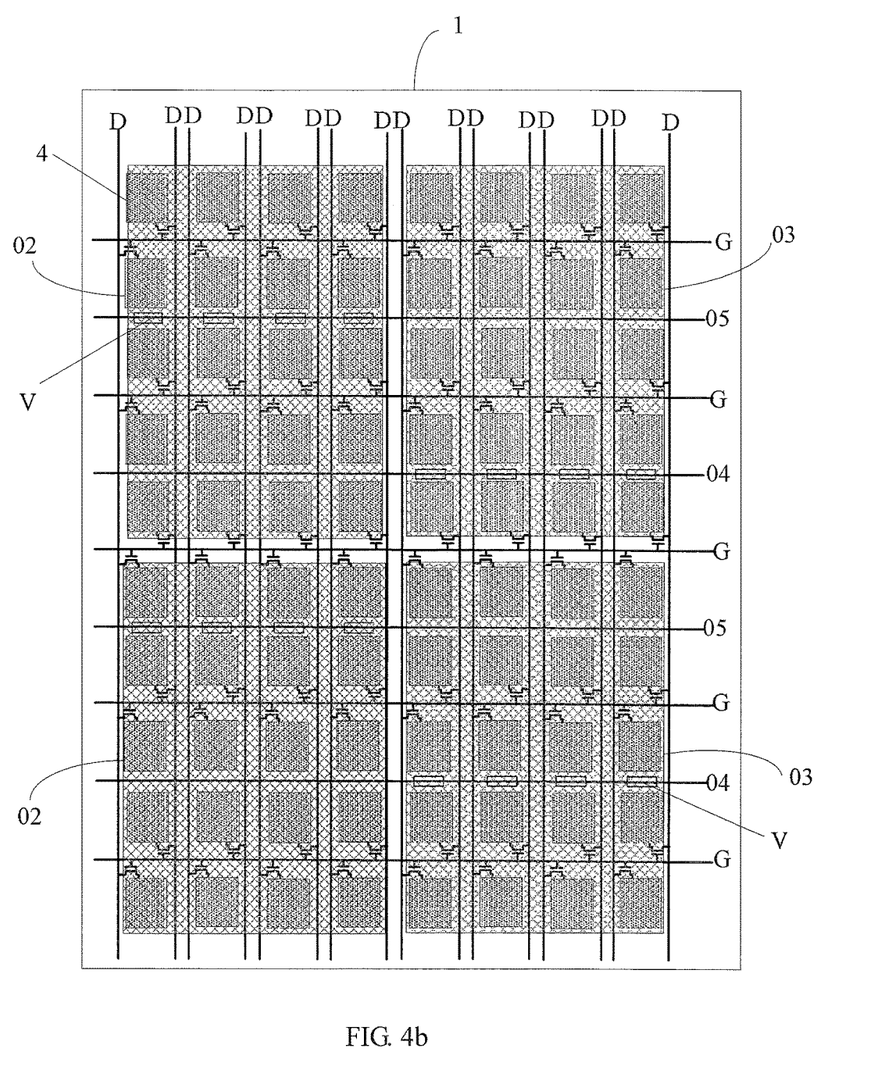
FIG. 4b is a sixth schematic top view of an in cell touch panel according to an embodiment of the present invention.

Preferably, in order to simplify manufacturing process and further reduce manufacturing cost, the above-mentioned in cell touch panel provided according to embodiments of the present invention, further comprises, as shown in FIG. 4a and FIG. 4b, a plurality of sub-pixels 4 provided to the side of the first substrate 1 facing the second substrate 2 and arranged in a matrix, and, grid signal lines G and data signal lines D which are provided across each other; the extension direction of the conducting wire 05 is the same as that of the grid signal line G, or is the same as that of the data signal line D.

As a result, the extension directions of the conducting wire and the common electrode wire are disposed to be the same as that of the grid signal line, or to be the same as that of the data signal line, so that the conducting wires and the common electrode wires are within display region of the display screen, but not occupy the frame region, so as to reduce width of the frame of the display screen, to the utmost extent, and facilitate a narrow-frame design. Preferably, in a specific implementation, in the above-mentioned in cell touch panel provided according to embodiments of the present invention, referring to FIG. 4a, two grid signal lines G are provided between two adjacent rows of the sub-pixels 4; and, two adjacent columns of the sub-pixels 4 constitute one pixel set and share one of the data signal lines D provided between the two adjacent columns of the sub-pixels 4. The conducting wires 05 and the common electrode wires 04 are provided alternately at gaps between adjacent pixel sets, and are disposed in the same layer with the data signal line D.

As a result, this double-grid design will cut down positions occupied by the data signal lines between adjacent pixel sets, such that, the conducting wires 05 and the common electrode wires 04 are provided alternately at gaps between adjacent pixel sets, and the conducting wires 05 and the common electrode wires 04 are electrically connected, through corresponding via-holes V, to corresponding second touch electrodes 02 and common electrodes 03, respectively.

Or, in a specific implementation, in the above-mentioned in cell touch panel provided according to embodiments of the present invention, as shown in FIG. 4b, two date signal lines D are provided between two adjacent columns of the sub-pixels 4; and, two adjacent rows of the sub-pixels 4 constitute one pixel set and share one of the grid signal lines G provided between the two adjacent rows of the sub-pixels. The conducting wires 05 and the common electrode wires 04 are provided alternately at gaps between adjacent pixel sets, and are disposed in the same layer with the grid signal line G.

As a result, this double-source design will cut down positions occupied by the grid signal lines between adjacent pixel sets, such that, the conducting wires 05 and the common electrode wires 04 are provided alternately at gaps between adjacent pixel sets, and the conducting wires 05 and the common electrode wires 04 are electrically connected, through corresponding via-holes V, to corresponding second touch electrodes 02 and common electrodes 03, respectively.

Specifically, in a specific implementation, a width of a gap between the first touch electrode and its adjacent second touch sub-electrode will affect directly change rate of touch operations, accordingly, the width of the gap between the first touch electrode and its adjacent second touch sub-electrode should not only ensure amount of change of the touch capacitance, but also satisfy requirement on the change rate. Preferably, in the above-mentioned in cell touch panel provided according to embodiments of the present invention, a width of a gap between the first touch electrode and its adjacent second touch sub-electrode corresponds to a width of three sub-pixels.

Figure 5:
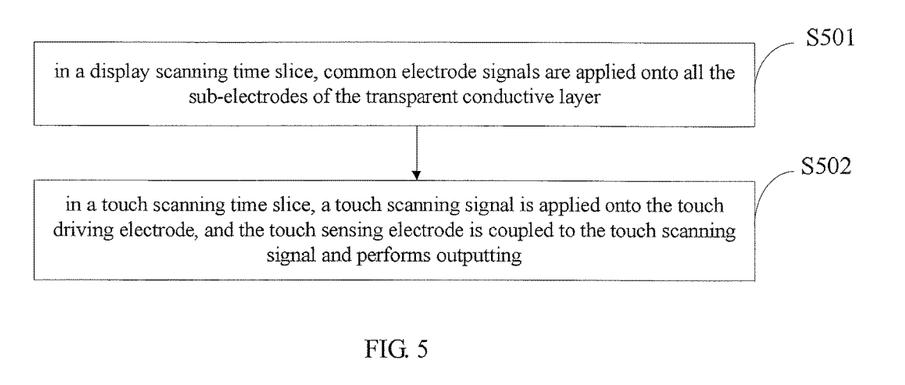
FIG. 5 is a schematic flow chart of a method for driving an in cell touch panel according to an embodiment of the present invention.

In accordance with the same inventive concept, embodiments of the present invention also provide a method for driving the abovementioned in cell touch panel. Referring to FIG. 5, the method may comprise: performing a display scanning and a touch scanning asynchronously, within a frame of time; wherein, S501, in a display scanning time slice, common electrode signals are applied onto all the sub-electrodes of the transparent conductive layer; and S502, in a touch scanning time slice, a touch scanning signal is applied onto the touch driving electrode, and the touch sensing electrode is coupled to the touch scanning signal and performs outputting.

Specifically, in a specific implementation, for a frame of time, sequence of carrying out step S501 and step S502 are not limited. The display scanning time slice may be before the touch scanning time slice, or, the touch scanning time slice may be before the display scanning time slice. There is no limitation on this, as long as sequence of carrying out step S501 and step S502 are the same within every frame of time.

In accordance with the same inventive concept, embodiments of the present invention further provide a display device comprising the abovementioned in cell touch panel provided according to embodiments of the present invention. The display device may include any products or components having a display function, such as, mobile phone, tablet PC, TV, display, notebook computer, digit photo frame, navigator, etc. For implementations of the display device, the abovementioned embodiments of the in cell touch panel may be referred to, and they will be omitted here for clear purpose.

Embodiments of the present invention provide an in cell touch panel and a method for driving the same, and a display device. According to embodiments of the present invention, a transparent conductive layer is divided into second touch electrodes and common electrodes, that is, a conventional entire common electrode layer is divided into second touch electrodes and common electrodes insulated from each other; accordingly, during a display operation, both the second touch electrodes and the common electrodes are applied with common electrode signals; and, during an touch operation, ones of the first touch electrodes and the second touch electrodes are applied with touch scanning signals while the other ones of the first touch electrodes and the second touch electrodes are coupled to the touch scanning signals and performs outputting, so that a touch function and a display function are achieved by asynchronous drivings. In the in cell touch panel provided according to embodiments of the present invention, the second touch electrodes are manufactured by performing some changes on conventional structure of the common electrode layer, accordingly, on the basis of the conventional manufacture steps, no additional steps should be included for sole manufacture of the second touch electrode, which reduces the production cost while improving the production efficiency. Moreover, in the above-mentioned in cell touch panel, the transparent conductive layer is divided into a plurality of sub-electrodes being independent from each other and arranged in a matrix, which not only ensures uniform distribution of the sub-electrodes of the entire touch panel, but also ensures match of loads of the common electrodes with that of the second touch sub-electrodes since the sub-electrodes of which the common electrode is made up has the same structure as the sub-electrodes of which the second touch electrode is made up. In addition, the first touch electrodes are provided to be in positions opposite to the common electrodes, so that no overlapped regions are formed between the first touch electrodes and the second touch electrodes, so as to reduce coupling capacitance between the first touch electrode and the second touch electrode, to the utmost extent.

Obviously, those skilled in the art may make various changes and modifications within principles and spirit of the present invention. Accordingly, the present invention intends to contain these changes and modifications if they are within the scope of the present invention defined in the claims and their equivalents.

What is claimed is:

1. An in cell touch panel, comprising a first substrate and a second substrate which are opposite to each other, wherein the in cell touch panel further comprises a transparent conductive layer provided to a side of the first substrate facing the second substrate, and a plurality of first touch electrodes insulated from the transparent conductive layer and provided in different layers with the transparent conductive layer; wherein, the transparent conductive layer is divided into a plurality of sub-electrodes being independent from each other and arranged in a matrix; wherein, ones of the sub-electrodes which are in odd-numbered rows and the sub-electrodes which are in even-numbered rows are second touch sub-electrodes, the other ones of the sub-electrodes which are in odd-numbered rows and the sub-electrodes which are in even-numbered rows are common electrodes, and the second touch sub-electrodes in one column or in one row constitute one second touch electrode;

an extension direction of the first touch electrodes is perpendicular to an extension direction of the second touch electrodes, and, the first touch electrodes are provided to be respectively opposite to, rows or columns of the common electrodes which are perpendicular to the second touch electrodes; and ones of the first touch electrodes and the second touch electrodes are touch driving electrodes, and the other ones of the first touch electrodes and the second touch electrodes are touch sensing electrodes.

2. The in cell touch panel of claim 1, wherein the first touch electrodes are each provided to a side of the second substrate facing the first substrate.

3. The in cell touch panel of claim 2, wherein the first touch electrodes are each made up of a plurality of strip-shaped first touch sub-electrodes.

4. The in cell touch panel of claim 3, wherein material for the first touch electrode comprises metal or transparent conductive material.

5. The in cell touch panel of claim 3, wherein the in cell touch panel further comprises a black matrix layer provided to the side of the first substrate facing the second substrate, or to the side of the second substrate facing the first substrate; and orthographic projections of patterns of the first touch electrodes on the first substrate are within a region where a pattern of the black matrix layer is disposed.

6. The in cell touch panel of claim 2, wherein the first touch electrodes each has a grid-shaped structure.

7. The in cell touch panel of claim 6, wherein material for the first touch electrode comprises metal or transparent conductive material.

8. The in cell touch panel of claim 6, wherein, the in cell touch panel further comprises a black matrix layer provided to the side of the first substrate facing the second substrate, or to the side of the second substrate facing the first substrate; and orthographic projections of patterns of the first touch electrodes on the first substrate are within a region where a pattern of the black matrix layer is disposed.

9. The in cell touch panel of claim 1, wherein one of the first substrate and the second substrate is an array substrate, and the other one of the first substrate and the second substrate is an opposite substrate.

10. The in cell touch panel of claim 9, wherein the first substrate is an array substrate and the second substrate is an opposite substrate, the in cell touch panel further comprises:

common electrode wires and conducting wires provided to the side of the first substrate facing the second substrate and disposed in different layers with the transparent conductive layer; wherein, the common electrode is electrically connected to the corresponding common electrode wire through a via-hole, and, the second touch electrode is electrically connected to the corresponding conducting wire through another via-hole.

11. The in cell touch panel of claim 10, wherein the conducting wire and the common electrode wire are disposed in the same layer with each other, and extension directions of the conducting wires and the common electrode wires are the same as the extension direction of the second touch electrode.

12. The in cell touch panel of claim 11, wherein the in cell touch panel further comprises: a plurality of sub-pixels provided to the side of the first substrate facing the second substrate and arranged in a matrix, and, grid signal lines and data signal lines which are provided across each other; and the extension direction of the conducting wire is the same as that of the grid signal line, or is the same as that of the data signal line.

13. The in cell touch panel of claim 12, wherein two of the grid signal lines are provided between two adjacent rows of the sub-pixels; and, two adjacent columns of the sub-pixels constitute one pixel set and share one of the data signal lines provided between the two adjacent columns of the sub-pixels; and the conducting wires and the common electrode wires are provided alternately at gaps between adjacent pixel sets, and are disposed in the same layer with the data signal line.

14. The in cell touch panel of claim 13, wherein, a width of a gap between the first touch electrode and adjacent said second touch sub-electrode corresponds to a width of three sub-pixels.

15. The in cell touch panel of claim 12, wherein two of the date signal lines are provided between two adjacent columns of the sub-pixels; and, two adjacent rows of the sub-pixels constitute one pixel set and share one of the grid signal lines provided between the two adjacent rows of the sub-pixels; and the conducting wires and the common electrode wires are provided alternately at gaps between adjacent pixel sets, and are disposed in the same layer with the grid signal line.

16. The in cell touch panel of claim 15, wherein, a width of a gap between the first touch electrode and adjacent said second touch sub-electrode corresponds to a width of three sub-pixels.

17. The in cell touch panel of claim 12, wherein a width of a gap between the first touch electrode and adjacent said second touch sub-electrode corresponds to a width of three sub-pixels.

18. A display device, wherein the display device comprises an in cell touch panel of claim 1.

19. A method of driving an in cell touch panel, wherein the in cell touch panel comprises a first substrate and a second substrate which are opposite to each other, wherein the in cell touch panel further comprises a transparent conductive layer provided to a side of the first substrate facing the second substrate, and a plurality of first touch electrodes insulated from the transparent conductive layer and provided in different layers with the transparent conductive layer; wherein, the transparent conductive layer is divided into a plurality of sub-electrodes being independent from each other and arranged in a matrix; wherein, ones of the sub-electrodes which are in odd-numbered rows and the sub-electrodes which are in even-numbered rows are second touch sub-electrodes, the other ones of the sub-electrodes which are in odd-numbered rows and the sub-electrodes which are in even-numbered rows are common electrodes, and the second touch sub-electrodes in one column or in one row constitute one second touch electrode; an extension direction of the first touch electrodes is perpendicular to an extension direction of the second touch electrodes, and, the first touch electrodes are provided to be respectively opposite to, rows or columns of the common electrodes which are perpendicular to the second touch electrodes; and ones of the first touch electrodes and the second touch electrodes are touch driving electrodes, and the other ones of the first touch electrodes and the second touch electrodes are touch sensing electrodes;

the method comprising:
performing a display scanning and a touch scanning asynchronously, within a frame of time;
applying, in a display scanning time slice, common electrode signals onto all the sub-electrodes of the transparent conductive layer; and
applying, in a touch scanning time slice, a touch scanning signal onto the touch driving electrode, such that the touch sensing electrode is coupled to the touch scanning signal and performs outputting.

* * * * *